United States Patent [19]
Amann et al.

[11] Patent Number: 5,260,960
[45] Date of Patent: Nov. 9, 1993

[54] TUNABLE SEMICONDUCTOR LASER ON A SEMI-INSULATING SUBSTRATE

[75] Inventors: Markus-Christian Amann, Munich; Stefan Illek, Feldkirchen-Westerham; Wolfgang Thulke, Munich, all of Fed. Rep. of Germany

[73] Assignee: Siemens Aktiengesellschaft, Munich, Fed. Rep. of Germany

[21] Appl. No.: 872,401

[22] Filed: Apr. 23, 1992

[30] Foreign Application Priority Data

Jul. 26, 1991 [DE] Fed. Rep. of Germany ....... 4124874

[51] Int. Cl.⁵ .............................................. H01S 3/19
[52] U.S. Cl. ........................................ 372/46; 372/20; 372/45
[58] Field of Search ...................... 372/46, 45, 50, 47, 372/20

[56] References Cited

U.S. PATENT DOCUMENTS

| | | | |
|---|---|---|---|
| 5,027,363 | 6/1991 | Takahashi | 372/46 |
| 5,048,049 | 9/1991 | Amann | 372/46 |
| 5,073,895 | 12/1991 | Omura | 372/46 |
| 5,155,560 | 10/1992 | Sheperd | 372/46 |

FOREIGN PATENT DOCUMENTS

| | | |
|---|---|---|
| 1-103890 | 4/1989 | European Pat. Off. . |
| 0360011 | 3/1990 | European Pat. Off. . |
| 0404551 | 12/1990 | European Pat. Off. . |
| 57-172790 | 1/1982 | Japan . |
| 3105991 | 5/1991 | Japan . |

OTHER PUBLICATIONS

"Fabrication and lasing characteristics of λ=1.56 μm tunable twin-guide (TTG) DFB lasers", C. F. J. Schanen et al., IEEE Proceedings-J, vol. 137, No. 1, Feb. 1990, pp. 69-73.

*Primary Examiner*—James W. Davie
*Attorney, Agent, or Firm*—Hill, Steadman & Simpson

[57] ABSTRACT

A tunable laser diode on a semi-insulating substrate having a stripe-shaped layer structure has an intermediate layer between an active layer and a tuning layer that is grown-over by an confinement layer that is doped for the same conductivity type as the intermediate layer. An oppositely doped, lateral region is electrically connected via an identically doped lower region to the active layer. An upper region is likewise oppositely doped and is electrically connected to the tuning layer. A contact layer is essentially planarly applied on the surface of the confinement layer and has respective portions on the appertaining regions on which the contacts provided with adequate bond areas are applied with a further contact layer for the common contact.

15 Claims, 1 Drawing Sheet

TUNABLE SEMICONDUCTOR LASER ON A SEMI-INSULATING SUBSTRATE

BACKGROUND OF THE INVENTION

The present invention is directed to a tunable semiconductor laser on a semi-insulating substrate having an active layer and a tuning layer, one arranged above the other.

It is necessary for numerous applications of semiconductor lasers to vary the wavelength of the emitted light as rapidly and steadily as possible. One example of this is optical heterodyne reception wherein the semiconductor laser serves as a local oscillator in the receiver for demodulation of the signal. European Patent Application EP 0 360 011 discloses a tunable DFB laser wherein an active layer and a tuning layer are vertically arranged relative to one another and separate current injection is possible via an intermediate layer arranged therebetween and via lateral regions. This laser is particularly suited (tuneable twin guide-distributed feedback laser diode, also referred to as a TTG-DFB laser diode) for the aforementioned purpose because of its broad, continuously variable tunability.

In prior art embodiments, this laser diode is manufactured on a p-doped substrate that represents the electrical lead to the active layer or to the tuning layer depending on which of these layers is located on a side of the intermediate layer facing toward the substrate. As a result, the substrate cannot be connected to the common electrical ground of the further components, but must be electrically insulated from the common sub-carrier. A TTG-DFB laser on an electrically insulating substrate that is simpler to manufacture and more mechanically stable is disclosed in German Patent Application P 40 37 896. The type of laser required for this purpose whose electrical contacts must all lie on one side of the laser layers for a semi-insulating substrate is also defined by a monolithically integrated, passive optical waveguide. The arrangement of the three required contacts in the laser diode of this patent application is facilitated in that adequate space for the bond area of at least one contact is available over the integrated waveguide. One disadvantage of this arrangement is the nonplanar surface of the laser diode that has steps several micrometers in height. It makes the manufacture of the contacts more difficult and diminishes the mechanical stability of this arrangement. The passive waveguide that enables the adequate bond areas is only of use in the monolithic integration of the laser diode.

SUMMARY OF THE INVENTION

It is an object of the present invention to provide a simply manufacturable TTG-DFB laser diode on a semi-insulating substrate, particularly as a discrete module.

This object is achieved by a laser diode on a semi-insulating substrate having a stripe-shaped layer structure that has an intermediate layer between two specific layers. At least one of the two layers is an active layer provided for generating a beam. A confinement layer that is essentially doped for electrical conduction first conductivity type laterally adjoins the stripe-shaped layer structure at both sides. An upper region that is doped for an opposite, second conductivity type is formed over the layer structure and a lateral region separated therefrom is provided that is doped for the second conductivity type and that is electrically conductively connected to that side of the layer structure facing toward the substrate. A contact layer having portions electrically separated from one another is provided on the upper region, on the lateral region and on a region of the confinement layer doped for the first conductivity type. Contacts separated from one another are provided for the portions of the contact layer, so that separate current injection is possible through the intermediate layer into each of the specific layers.

Further developments of the present invention are as follows. A lower region doped for the second conductivity type is formed in the substrate, this lower region electrically connecting the lateral region to that side of the layer structure facing toward the substrate. The contact that is provided for a portion of the contact layer applied on a region of the confinement layer doped for the first conductivity type is applied on a further contact layer that is highly doped for the first conductivity type. A contact provided for a portion of the contact layer that is not arranged on the upper region has an omega-shaped configuration in plan view that leaves free a region for a bonding area of the contact provided for that portion of the contact layer arranged on the upper region. One of the specific layers can be a tuning layer provided for wavelength variations in the laser diode. The tuning layer can be arranged on that side of the intermediate layer facing toward the substrate or the tuning layer can be arranged on that side of the intermediate layer facing away from the substrate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

In the laser diode of the present invention, the stripe-shaped layer structure that comprises the active layer and the tuning layer with the intermediate layer arranged therebetween is grown over with a confinement layer. The confinement layer has a part present on the stripe-shaped layer structure that is doped opposite the rest of this confinement layer, so that a separate current injection into the layer arranged above the intermediate layer can occur by means of a laterally applied contact and a stripe-shaped contact that proceeds along the layer structure. The current injection into the layer arranged on that side of the intermediate layer facing toward the substrate occurs by means of a further, laterally arranged contact on a region that is likewise oppositely doped in comparison to the remaining material of the confinement layer. This region has an extension, for example with a buffer layer or an upper layer part of the substrate up to that side of the stripe-shaped layer structure facing toward the substrate. The embodiments set forth below recite two solutions of how the contacts can be provided with adequately large bond areas. This thereby solves the problem of specifying a laser diode on a semi-insulating substrate having two layers vertically arranged relative to one another and separately drivable, this laser diode having an essentially planar structure.

Figure 1:
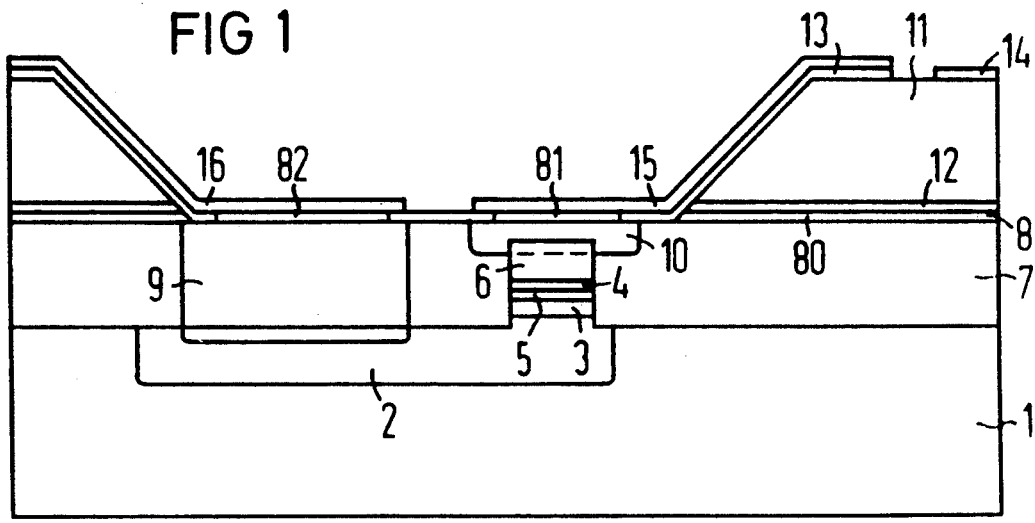
FIGS. 1 and 2 are cross-sectional views of exemplary embodiments of the laser diode of the present invention.

In FIG. 1, a stripe-shaped layer structure that is surrounded laterally and at the top by a confinement layer 7 is applied on a substrate 1 of semi-insulating material. The layer structure comprises an active layer 3, an intermediate layer 5, a tuning layer 4 and a further confinement layer 6. Alternatively to the embodiment depicted in FIG. 1, the tuning layer 4 can be arranged at that side of the intermediate layer 5 facing toward the substrate 1 and the active layer 3 can be arranged at that side of the intermediate layer 5 facing away from the substrate 1. A second active layer can also be provided instead of the tuning layer. The intermediate layer 5 and the confinement layer 7 are doped for a first conductivity type (for example, n-conduction). The further envelope layer 6, that can also be a component part of the confinement layer 7, is doped for the opposite conductivity type (for example, p-conduction). The further confinement layer 6 that forms the upper portion of the stripe-shaped layer structure serves the purpose of a sharp limitation of the doped upper region 10 fashioned in the confinement layer 7, this region 10 being doped for the second conductivity type (p-conduction). This upper region 10, for example, can be produced by implantation or diffusion into the upper portion of the lightly doped confinement layer 7. A lateral region 9 that is likewise redoped for the second conductivity type is formed in the confinement layer 7 at one side of the layer structure. This lateral region 9 is electrically connected to the lowest layer (active layer 3) of the layer structure via a lower region 2. As shown in FIG. 1, this lower region 2 can be fashioned in the substrate 1 or in a buffer layer applied onto the substrate.

A contact layer 8, that has a first portion 80 on a portion of the confinement layer 7 doped for the first conductivity type, a second portion 81 on the upper region 10 and a third portion 82 on the lateral region 9, is applied on the essentially planar surface of the confinement layer 7. These portions 80, 81, 82 of the contact layer 8 are electrically insulated from one another (for example, by the oxide layer 13). In order to enable an adequate width of a contact 15 applied on that portion 81 of the contact layer 8 situated on the upper region 10, a further contact layer 11 is provided for a lateral contact 14. This further contact layer 11 is sufficiently highly doped, so that this contact layer 11 has sufficiently high conductivity and compensates for the great distance of the laterally applied contact from the stripe-shaped layer structure. The middle contact 15 can therefore be fashioned sufficiently broad and with sufficiently large bond areas. An etch stop layer 12 is situated between the contact layer 8 and the further contact layer 11. An oxide layer 13 serves the purpose of insulation between portions of the contact layer 8 that are respectively electrically separated from one another. The advantage of this embodiment is the simple form of the contact metallizations. They can be fashioned as broad strips extending over the entire length of the laser structure that offer adequate space for bond terminals.

Figure 2:
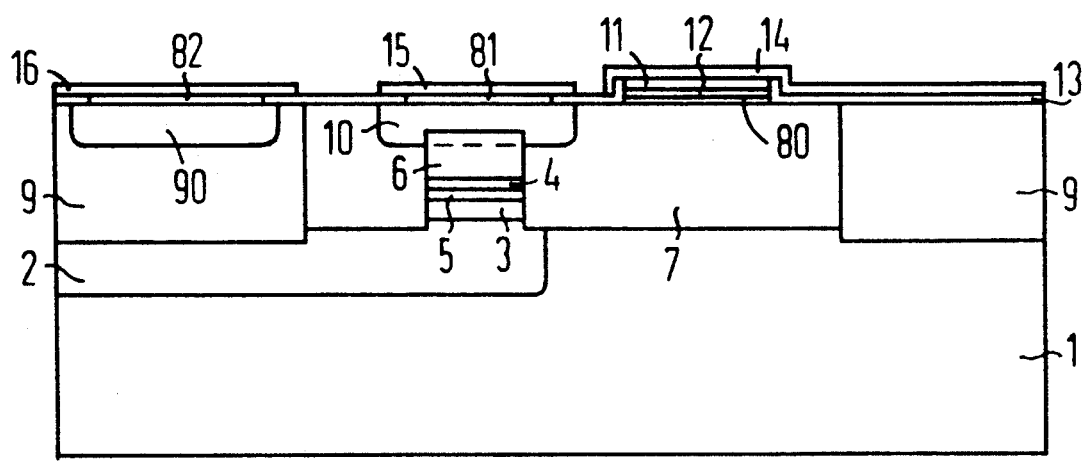

In the embodiment of FIG. 2, the further contact layer 11 is thin and, like the portion 80 of the contact layer situated therebelow, has the shape of a narrow stripe. The portions of the contact layer on a more highly doped, upper portion 90 of the lateral region 9 and on the upper region 10 are likewise stripe-shaped. An etch stop layer 12 between the further contact layer 11 and the portion 80 of the contact layer is likewise stripe-shaped. The electrical connection of the lowest layer (active layer 3 in this exemplary embodiment) via the lateral region 9 and via the lower region 2 can thereby also be realized with an epitaxially grown, p-doped semiconductor layer in addition to being realized by diffusion or implantation of dopant.

Figure 3:
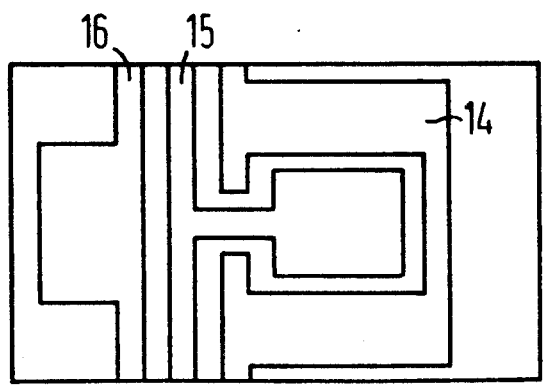
FIG. 3 is a plan view of the exemplary embodiment of FIG. 2.

In this embodiment, the contact metallizations (contacts 14, 15, 16) can no longer have the shape of broad strips since the conductivity of the thin, further contact layer 11 is too low in order to bridge great distances. A possible form of the contact metallization for this embodiment is shown in plan view in FIG. 3. One of the laterally applied contacts 14 is omega shaped. The stripe-shaped portion of this contact 14 situated over the appertaining portion of the contact layer 8 is configured to enable a connection of the middle contact 15 that is applied over the upper region 10 with an adequately large bond area in the region left free by the omega-shaped contact 14.

The laser diode of the present invention is manufactured such that a locally limited, p-conductive region that is provided for the lower region 2 is produced in the substrate 1 or in a semiconductor layer grown thereon, being produced in the region of the laser stripe to be defined later by diffusion or implantation of dopant. Subsequently, the layers of the basic laser structure are epitaxially deposited surface-wide. These layers contain an active layer 3 and a tuning layer 4 that are separated from one another by a thin, n-conductive intermediate layer 5. The active layer 3 can be arranged over or under the intermediate layer 5. This layer sequence is upwardly terminated by a p-conductive, upper confinement layer 6.

These layers are etched back to form a narrow ridge in a photolithographic manner and the n-conductive confinement layer 7 is subsequently grown over this narrow ridge. The level of the doping density of this layer is so slight that it allows a later, local redoping into a p-conductivity type by diffusion or implantation for manufacturing the upper region 10 and the lateral region 9. Corresponding to the two embodiments set forth, the contact layer 8 and the further contact layer 11 are grown on and structured. The oxide layer 13 is applied for the electrical insulation and the contacts 14, 15, 16 are subsequently applied. The contact layer 8 is initially lightly n-conductively doped. After the application of this contact layer 8, the upper region 10 is manufactured by diffusion or implantation of dopant, whereby the appertaining portion 81 of the contact layer 8 is redoped into a highly p-conductive layer. The diffusion or, respectively, implantation is undertaken to such an extent that the upper region 10 extends at least up to the further confinement layer 6. The further confinement layer effects a sharp limitation of the p-conductively doped region from the following layer (tuning layer 4) of the laser layer structure. The further confinement layer 6 can therefore be counted as a portion of the confinement layer 7 belonging to the upper region 10. As a result of the low doping level of the contact layer 8 in the n-conductive region of the confinement layer 7, a further contact layer 11 is applied in this region in both embodiments. This further contact layer 11 is highly n-conductively doped in both embodiments.

Given a practically planar structure, the laser diode of the present invention makes it possible to arrange all contacts with adequately large bond areas on the grown-over surface of the component.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A laser diode on a semi-insulating substrate, comprising:
   a stripe-shaped layer structure having an intermediate layer located between two predetermined layers, at least one layer of said two predetermined layers being an active layer provided for generating a light emission;
   a confinement layer, that is substantially doped for electrical conduction of a first conductivity type, laterally adjoining said stripe-shaped layer structure at both sides thereof;
   an upper region that is doped for a second conductivity type, the second conductivity type being opposite the first conductivity type, over said stripe-shaped layer structure and a lateral region located laterally relative to said stripe-shaped layer structure and separated from said stripe-shaped layer structure by a portion of said confinement layer, said lateral region being doped for the second conductivity type and being electrically conductively connected to a side of said layer structure facing toward the substrate, said lateral region being separate from said upper region;
   a contact layer having respective portions electrically separated from one another on said upper region, on said lateral region and on a region of said confinement layer doped for the first conductivity type; and
   respective contacts separated from one another for said portions of said contact layer, so that separate current injection is provided through said intermediate layer into each of said two predetermined layers.

2. The laser diode according to claim 1, wherein the laser diode further comprises a lower region, doped for the second conductivity type, in the substrate, said lower region electrically connecting said lateral region to said side of said stripe-shaped layer structure facing toward the substrate.

3. The laser diode according to claim 1, wherein a contact of said respective contacts, that is provided for said portion of the contact layer applied on said region of said confinement layer doped for the first conductivity type, is applied on a further contact layer, that is highly doped for the first conductivity type.

4. The laser diode according to claim 1, wherein a contact of said respective contacts, that is provided for said portion of said contact layer that is not arranged on said upper region, has an omega-shaped configuration that leaves free a region for a bonding area of a contact of said respective contacts, that is provided for said portion of said contact layer arranged on said upper region.

5. The laser diode according to claim 1, wherein one of said two predetermined layers is a tuning layer provided for wavelength variation of the laser diode.

6. The laser diode according to claim 5, wherein said tuning layer is arranged on a side of said intermediate layer facing toward the substrate.

7. The laser diode according to claim 5, wherein said tuning layer is arranged on a side of said intermediate layer facing away from the substrate.

8. A laser diode on a semi-insulating substrate, comprising:
   a stripe-shaped layer structure having an intermediate layer located between two predetermined layers, at least one layer of said two predetermined layers being an active layer provided for generating a light emission;
   a confinement layer, that is substantially doped for electrical conduction of a first conductivity type, laterally adjoining said stripe-shaped layer structure at both sides thereof;
   an upper region that is doped for a second conductivity type, the second conductivity type being opposite the first conductivity type, over said stripe-shaped layer structure and a lateral region located laterally relative to said stripe-shaped layer structure and separated from said stripe-shaped layer structure by a portion of said confinement layer, said lateral region being doped for the second conductivity type and being electrically conductively connected to a side of said layer structure facing toward the substrate, said lateral region being separate from said upper region;
   a lower region, doped for the second conductivity type, in the substrate, said lower region electrically connecting said lateral region to said side of said stripe-shaped layer structure facing toward the substrate;
   a contact layer having respective portions electrically separated from one another on said upper region, on said lateral region and on a region of said confinement layer doped for the first conductivity type;
   respective contacts separated from one another for said portions of said contact layer, so that separate current injection is provided through said intermediate layer into each of said two predetermined layers; and
   a contact of said respective contacts, that is provided for said portion of said contact layer applied on a region of said confinement layer doped for the first conductivity type, being applied on a further contact layer, that is highly doped for the first conductivity type.

9. The laser diode according to claim 8, wherein one of said two predetermined layers is a tuning layer provided for wavelength variation of the laser diode.

10. The laser diode according to claim 8, wherein said tuning layer is arranged on a side of said intermediate layer facing toward the substrate.

11. The laser diode according to claim 8, wherein said tuning layer is arranged on a side of said intermediate layer facing away from the substrate.

12. A laser diode on a semi-insulating substrate, comprising:
   a stripe-shaped layer structure having an intermediate layer located between two predetermined layers, at least one layer of said two predetermined layers being an active layer provided for generating a light emission;

a confinement layer, that is substantially doped for electrical conduction of a first conductivity type, laterally adjoining said stripe-shaped layer structure at both sides thereof;

an upper region that is doped for a second conductivity type, the second conductivity type being opposite the first conductivity type, over said stripe-shaped layer structure and a lateral region located laterally relative to said stripe-shaped layer structure and separated from said stripe-shaped layer structure by a portion of said confinement layer, said lateral region being doped for the second conductivity type and being electrically conductively connected to a side of said layer structure facing toward the substrate, said lateral region being separate from said upper region;

a lower region, doped for the second conductivity type, in the substrate, said lower region electrically connecting said lateral region to said side of said stripe-shaped layer structure facing toward the substrate;

a contact layer having respective portions electrically separated from one another on said upper region, on said lateral region and on a region of said confinement layer doped for the first conductivity type;

respective contacts separated from one another for said portions of said contact layer, so that separate current injection is provided through said intermediate layer into each of said two predetermined layers;

a contact of said respective contacts, that is provided for said portion of said contact layer that is not arranged on said upper region, having an omega-shaped configuration that leaves free a region for a bonding area of a contact of said respective contacts, that is provided for said portion of said contact layer arranged on said upper region.

13. The laser diode according to claim 12, wherein one of said two predetermined layers is a tuning layer provided for wavelength variation of the laser diode.

14. The laser diode according to claim 12, wherein said tuning layer is arranged on a side of said intermediate layer facing toward the substrate.

15. The laser diode according to claim 12, wherein said tuning layer is arranged on a side of said intermediate layer facing away from the substrate.

* * * * *